(12) United States Patent
Murden et al.

(10) Patent No.: US 6,987,471 B1
(45) Date of Patent: Jan. 17, 2006

(54) BIAS CONTROLLERS AND METHODS FOR ENHANCED SYSTEM EFFICIENCY

(75) Inventors: Franklin M. Murden, Greensboro, NC (US); James C. Camp, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/923,636

(22) Filed: Aug. 20, 2004

(51) Int. Cl.
*H03M 1/06* (2006.01)
(52) U.S. Cl. .................................. 341/118; 327/535
(58) Field of Classification Search ............. 341/155, 341/118, 120; 327/63, 74, 75, 89, 535, 538; 330/296
See application file for complete search history.

(56) References Cited

U.S. PATENT DOCUMENTS

| | | | | |
|---|---|---|---|---|
| 4,384,219 A | * | 5/1983 | Davis | 327/80 |
| 5,081,570 A | * | 1/1992 | Chibani et al. | 363/17 |
| 5,287,023 A | * | 2/1994 | Miyasaka | 327/389 |
| 6,066,976 A | * | 5/2000 | Cho | 327/350 |
| 6,323,695 B1 | * | 11/2001 | Heinrich | 327/89 |
| 6,486,661 B2 | * | 11/2002 | Chia et al. | 324/225 |
| 6,563,385 B2 | | 5/2003 | Wojslaw | 330/296 |
| 6,614,309 B1 | | 9/2003 | Pehlke | 330/296 |
| 6,629,638 B1 | | 10/2003 | Sanchez | 235/454 |
| 6,653,898 B2 | | 11/2003 | Monroe | 330/51 |
| 6,657,499 B2 | | 12/2003 | Lin | 330/296 |
| 6,731,916 B1 | | 5/2004 | Haruyama | 455/194.2 |

OTHER PUBLICATIONS

"RF Power Amplifier Bias Control", Controller X9470 preliminary information, pp. 1 and 12-17 at Xicor.com.
Okaniwa, Yusuke, "A CMOS Clocked Comparator for High-Speed Serial Communication", 2004 Symposium on VLSI Circuits, Digest of Technical Papers, pp. 198-201.

\* cited by examiner

*Primary Examiner*—Peguy JeanPierre
(74) *Attorney, Agent, or Firm*—Koppel, Jacobs, Patrick & Heybl

(57) ABSTRACT

Bias controllers are provided which alter a bias control signal so that a bias signal (e.g., a current signal) of an electronic network rapidly responds to increases in the rate-of-change of the network's analog input signal. This enhances the linearity of a system that includes the electronic network. Subsequent decreases in the rate-of-change are sensed and a decrease of the bias control signal is then paced at a rate selected to ignore short-term rate-of-change variations (e.g., modulation variations) but follow longer-term rate-of-change reductions to thereby enhance system efficiency without sacrificing system linearity.

12 Claims, 4 Drawing Sheets

BIAS CONTROLLERS AND METHODS FOR ENHANCED SYSTEM EFFICIENCY

BACKGROUND OF THE INVENTION

1. Field of the Invention

The present invention relates generally to the control of bias signals.

2. Description of the Related Art

Many electronic systems (e.g., signal conditioning systems such as analog-to-digital converters) include electronic networks whose current demands vary as they respond to varying parameters (e.g., frequency and amplitude) in the signals they process. Because they must faithfully process signals in the presence of the most current-demanding extremes of these parameters, these networks are generally provided with the large bias currents that correspond to these extremes. Accordingly, the efficiencies of these systems are degraded since these extremes generally occur only during a small portion of their operational time spans.

BRIEF SUMMARY OF THE INVENTION

Embodiments of the present invention are directed to bias controllers and methods that enhance system efficiency. The novel features of the invention are set forth with particularity in the appended claims. The invention will be best understood from the following description when read in conjunction with the accompanying drawings.

DETAILED DESCRIPTION OF THE INVENTION

Figure 1:
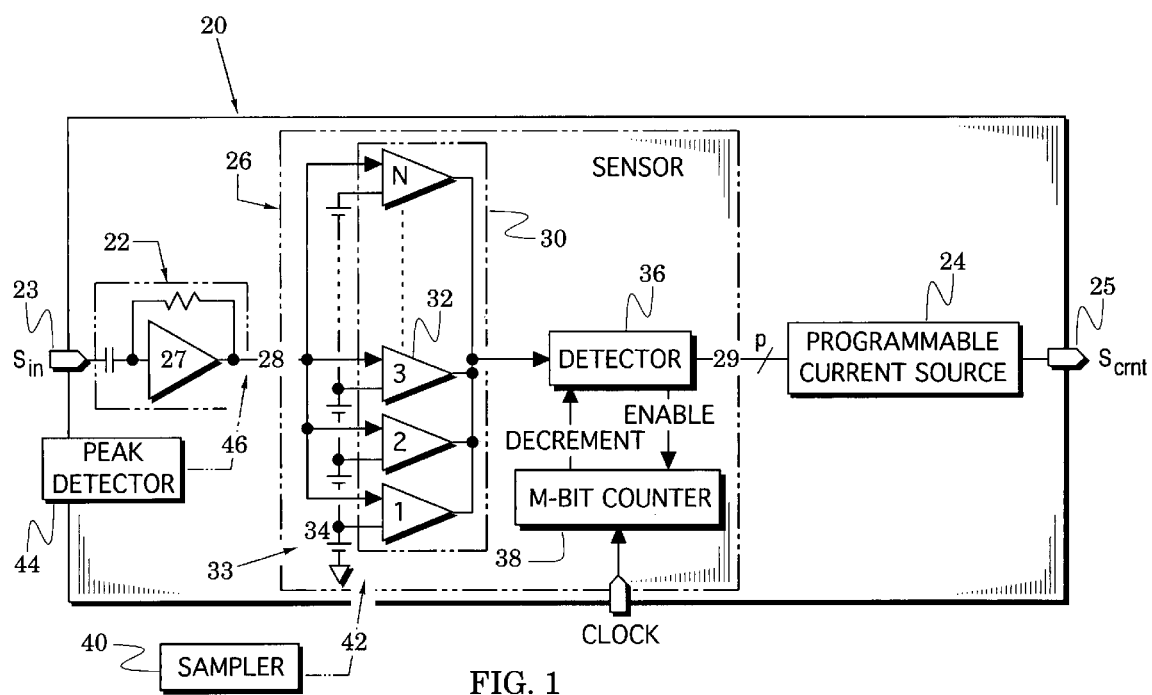
FIG. 1 is a diagram of a bias controller embodiment of the present invention.

Bias controllers are provided which alter a bias control signal so that a bias signal (e.g., a current signal) of an electronic network rapidly responds to increases in the rate-of-change of the network's analog input signal. This enhances the linearity of a system that includes the electronic network. Subsequent decreases in the rate-of-change are sensed and a decrease of the bias control signal is then paced at a rate selected to ignore short-term rate-of-change variations (e.g., modulation variations) but follow longer-term rate-of-change reductions to thereby enhance system efficiency without sacrificing system linearity.

In particular, the bias controller 20 includes a differentiator 22 coupled to an input port 23, a programmable current source 24 coupled to an output port 25 and a sensor 26 coupled between the differentiator and the current source. In the embodiment shown, the differentiator is formed with a capacitor that couples an analog input signal $S_{in}$ from the input port 23 to a high-input-impedance amplifier 27 that has a resistor coupled between its input and output so that current through the capacitor flows through the resistor and generates a derivative signal 28 that corresponds to the rate-of-change of the input signal $S_{in}$.

The current source 24 is configured to provide a current signal $S_{crnt}$ at the output port 25 whose amplitude corresponds to a bias control signal in the form of a current control signal 29 such as the p-bit signal shown in FIG. 1. In a first phase of operation, the sensor 26 is configured to alter the current control signal 29 in a first direction in response to an increase of the derivative signal 28. For example, the current control signal 29 can increase with increases in the derivative signal 28 and these increases command increases in the current signal $S_{crnt}$ at the output port 25. If the operation of the sensor 26 is clocked by a clock signal, the current control signal 29 can achieve any commanded increase (e.g., a full scale increase) in a single clock period and the programmable current source 24 can thus provide any increased current signal (e.g., a maximum current signal $S_{crnt}$) in a single clock period.

In a second phase of operation, the sensor 26 is configured to detect a subsequent decrease of the derivative signal 28 and, in a corresponding third phase of operation, the sensor alters, at a selectable rate, the current control signal 29 in a second direction in response to this decrease. In the present example, the current control signal 29 is decreased at the selectable rate which can be chosen to slowly reduce the current signal $S_{crnt}$.

Thus, the bias controller 20 responds to an increase of the derivative signal 28 by rapidly increasing the current signal $S_{crnt}$ (i.e., the controller exhibits a "fast attack"). The bias controller also detects a subsequent decrease of the derivative signal 28 and, in response, decreases the current signal $S_{crnt}$ at a selectable rate (i.e., the controller can thereby exhibit a "slow decay").

In an important feature of an embodiment of the invention, the bias controller is especially suited to rapidly supply current to elements of a system (e.g., an analog-to-digital converter) so that they can properly respond to a sudden increase in the rate-of-change of an input signal. When the rate-of-change subsequently declines, the bias controller can sense this and then ramp down the current signal $S_{crnt}$ at a selected rate. The bias controller, therefore, can be configured to ignore rapid fluctuations of the input signal $S_{in}$ (e.g., due to signal modulation) and only decrease the current signal $S_{crnt}$ in response to long term decreases in the rate-of-change of the input signal $S_{in}$.

In an embodiment of the sensor 26, it includes a set 30 of comparators 32 coupled to the differentiator to provide an indication of the increase and decrease of the rate-of-change of the input signal Sin. The comparators 32 compare the derivative signal 28 to increasing reference signals (symbolized in FIG. 1 with a string 33 of battery symbols 34) and can be configured to provide, for example, a thermometer type of response. In an exemplary response, the derivative signal 28 might be sufficient to flip the first three comparators so that the corresponding signal to a detector 36 would be 0–0111. The detector instantly provides a p-bit signal to the current source 24 to obtain the corresponding level of the current signal $S_{crnt}$.

If the detector detects a subsequent decrease of the derivative signal 28, it provides an enable signal to an M-bit counter 38 which is driven by a clock signal. When the M-bit counter then reaches an output count (generally $2^M$), it provides a decrement signal to the detector which generates a corresponding decrease of the p-bit signal and a corresponding decrease in the current signal $S_{crnt}$. This decrease continues to be paced by the M-bit counter until the detector senses that the current control signal 29 has reached a level that corresponds to the present state of the derivative signal 28. The decrease of the current signal $S_{crnt}$ can thus be controlled at a desired rate. For example, the clock could pulse every 10 nanoseconds and M could be 8 so that every 256 clocks or every 2.56 microseconds, the current signal $S_{crnt}$ exhibits a decrease step.

It was previously noted that the derivative signal 28 corresponds to the rate-of-change of the input signal $S_{in}$. If, for example, the input signal $S_{in}$ is a sinusoid with amplitude A and frequency f, the derivative signal 28 is a phase-shifted (substantially 90 degrees) sinusoid with an amplitude $A2\pi f$. The current demand of many electronic networks is substantially proportional to this derivative amplitude and, accordingly, the derivative signal provides a measure of this current demand.

The comparators 32 are preferably regenerative detectors that receive the clock signal and, in response, flip to a detected state (e.g., a "one" state) when the derivative signal exceeds their respective reference signal and are then reset by the clock signal. Alternatively, in a different controller embodiment, a peak detector 44 is inserted after the differentiator 22 as indicated by the insertion arrow 46 in FIG. 1 to momentarily hold the derivative signal (e.g., for a clock period) for subsequent response of the comparators.

As indicated by a replacement arrow 42, other controller embodiments can be formed by replacing the set 30 of comparators 32 with other sensing devices such as the sampler 40 shown in FIG. 1 which would generally be driven by the clock signal. It is further noted that, although p of the p-bit signal generated by the detector 36 may be the same as the number N of comparators 32 in one controller embodiment, it need not be in other controller embodiments.

Figure 2:
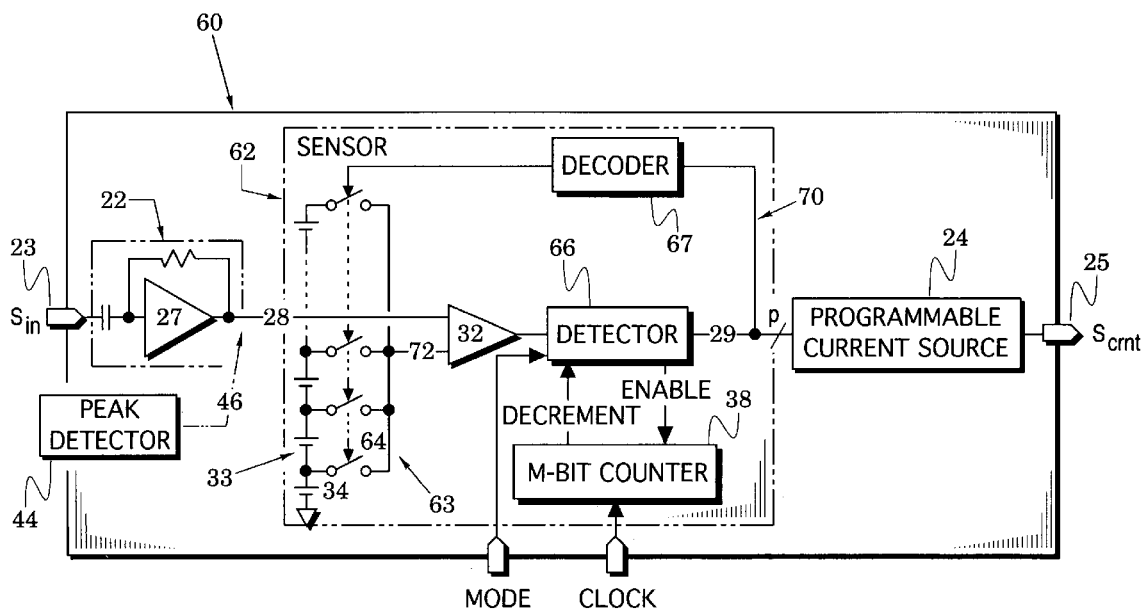
FIG. 2 is a diagram of another bias controller embodiment.

The bias controller 60 of FIG. 2 includes elements of the bias controller 20 of FIG. 1 with like elements indicated by like reference numbers. The sensor 26 of FIG. 1 is, however, replaced by a sensor 62 which includes a set 63 of switches 64, a comparator 32, a detector 66 and a decoder 67. The comparator 32 is coupled between the set 63 and the detector 66 and the detector is coupled back to the set 62 to thereby form a feedback loop 70.

Different reference signals (provided, for example, by the string 33 of battery symbols 34 that was introduced in FIG. 1) can be selected by the switches 64 to thereby provide a selectable reference signal 72. The comparator 32 (similar to the comparators 32 of FIG. 1) compares the derivative signal 28 to the selectable reference signal 72 to thereby indicate an increase or decrease of the derivative signal. In response, the detector 66 provides the current control signal 29 to the programmable current source and also to the decoder 67 which drives the set 68 of switches.

In this sensor embodiment 62, the detector 66 initially commands (via the decoder 67) the switches 34 to positions that provide an initial reference signal 72 such as the lowest reference signal which can be considered to be a threshold signal. If the derivative signal 28 exceeds this threshold signal, the detector 66 responds by incrementing the current control signal 29 which commands (via the decoder 67) the switches 34 to select the next highest reference signal.

This increasing process continues until the derivative signal 28 no longer exceeds the selected reference signal 72 or until the largest reference signal has been selected. If there are N reference signals and the detector performs this process in response to a clock signal, the current control signal 29 will reach its maximum level in N-1 clocks.

If the derivative signal 28 subsequently drops below the selected reference signal 72, the detector provides the enable signal of FIG. 2 to the M-bit counter 36 which is driven by a clock signal. The counter begins counting clock signals and when it reaches an output count (generally $2^M$), it provides a decrement signal to the detector which generates a corresponding decrease of the current control signal 29 and a corresponding decrease in the current signal $S_{crnt}$.

This decreasing process continues to be paced by the M-bit counter until the detector 66 senses (via the feedback loop 70) that the current control signal 29 has reached a level that corresponds to the present state of the derivative signal 28. The increasing and decreasing processes are facilitated with the decoder 67 which decodes the present p-bit signal to thereby select a switch that provides a reference signal that corresponds to the present current control signal 29.

The detector 66 receives mode signals which can command operational modes different than that described above. One additional mode concerns controller operation after the derivative signal 28 initially rises above a threshold signal. In this additional mode, the detector 66 is configured to respond by commanding a predetermined current control signal 29 greater than that corresponding to the reference signal that immediately exceeds the threshold signal.

In a first example, the detector 66 immediately provides the maximum current control signal so that the current signal $S_{crnt}$ immediately steps to its maximum value. If the detector senses (via the comparator 32) that the derivative signal 28 does not exceed the corresponding reference signal 72, it enables the M-bit counter which begins to pace a reduction of the current control signal until the corresponding reference signal drops below the derivative signal.

Another operational mode differs from that just described in that the detector 66 immediately provides a current control signal other than the maximum. The provided current control signal, for example, may be a mid-scale current control signal that is substantially half way between the maximum current control signal and the current control signal that corresponds to the threshold reference signal.

The reduction of current drain has become increasingly important for many modern battery-powered communication devices (e.g., cellular phones). An embodiment of the present invention recognizes that portions of these devices must rapidly respond to high levels of input signal parameters (e.g., frequency and amplitude) but can operate with reduced current supply when these parameters subsequently drop to lower levels. In signal conditioning systems, an exemplary device portion is the sampler of an analog-to-digital converter.

Accordingly, the controller embodiments of FIGS. 1 and 2 exhibit a "fast attack" and a "slow decay". In a mode of the controller embodiment 60 of FIG. 2 that was described above, the detector 66 immediately provides a maximum current control signal 29 when it senses that the derivative signal 28 has increased above a predetermined reference signal such as the lowest or threshold level signal. In this controller mode, the current signal $S_{crnt}$ may overshoot the required level which temporarily reduces system efficiency but insures that system linearity is enhanced.

In another operational mode, the detector 66 (and its decoder 67) steps the current control signal 29 upward until the switch set 63 provides a reference signal that just exceeds the derivative signal 28. In this controller mode, system efficiency is enhanced but system linearity may be degraded until this level of reference signal is reached. Other operational modes that lie between these extremes (such as a mode in which the detector 66 immediately provides a mid-scale current control signal) will provide a compromise between system efficiency and system linearity.

Figure 3:
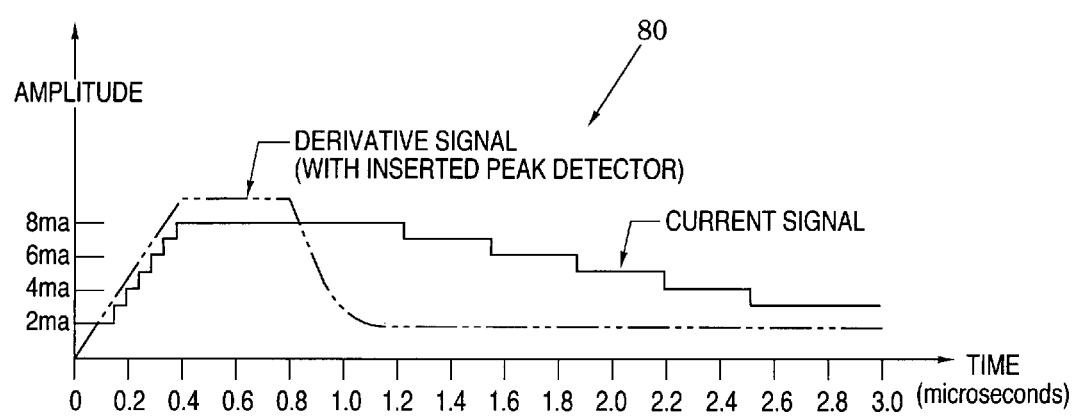
FIG. 3 is a plot of a derivative signal and a corresponding current signal in the controller embodiments of FIGS. 1 and 2.

The graph 80 of FIG. 3 illustrates a simulation of a controller embodiment of the invention. This embodiment included the peak detector 44 shown in FIGS. 1 and 2 and employed a 5-bit counter for the counter 38. The simulation was based on a 100 MSPS (megasample/second) clock and an exemplary input signal that caused the derivative signal (28 in FIGS. 1 and 2) to ramp up to a peak in the first 400 nanoseconds. Because of the inserted peak detector, the simulation plot remains at this level before declining in the region of 400-800 nanoseconds. The derivative signal declines to zero but, because of the inserted peak detector, the simulation plot plateaus at a level above zero.

In response, the sensor (26 and 62 in FIGS. 1 and 2) rapidly steps the current signal ($S_{crnt}$ at output port 25 in FIGS. 1 and 2) from a threshold current of 2 milliamps up to a maximum current of 8 milliamps. After sensing a decrease of the derivative signal at 800 nanoseconds, the detector (36 and 66 in FIGS. 1 and 2) enables the M-bit counter (38 in FIGS. 1 and 2) which then decrements the detector every 320 nanoseconds (($1/(100\times10^6))(2^5)$) so that the current signal slowly decays away to a level somewhat above the threshold current (which it reaches at approximately 2500 nanoseconds).

As previously noted, bias controller embodiments of the invention are configured to ignore expected rapid fluctuations of the input signal $S_{in}$ and only decrease the current signal $S_{crnt}$ in response to longer-term decreases in the rate-of-change of the input signal $S_{in}$. Consider, for example, an exemplary input signal $S_{in}$ in the bias controllers 20 and 60 of FIGS. 1 and 2 that is the combination of two substantially-equal signals separated by 200 KHz.

If the clock rate is 100 MSPS, the counter 38 of FIGS. 1 and 2 could be selected to be an 8-bit counter so that its first decrement signal (to the detectors 36 and 66 of FIGS. 1 and 2) occurs no earlier than 256(10 nanoseconds) or 2.56 microseconds which substantially matches the expected time span between peaks of the amplitude envelope of the input signal which is on the order of the inverse of $2(200\times10^3)$ or 2.5 microseconds. Accordingly, the signal envelope variations will be substantially ignored and the current signal $S_{crnt}$ will only be reduced if a subsequent reduction in the input signal amplitude occurs over a time span that significantly exceeds 2.5 microseconds.

Another exemplary input signal $S_{in}$ is a signal that is amplitude modulated at a rate of 30 KHz with a modulation index of 100%. With the 100 MSPS clock rate, the counter 38 of FIGS. 1 and 2 could now be selected to be an 11-bit counter so that its first decrement signal (to the detectors 36 and 66 of FIGS. 1 and 2) occurs no earlier than 2048(10 nanoseconds) or 20.5 microseconds which somewhat exceeds the expected time span between peaks of the amplitude envelope of the input signal which is on the order of the inverse of $2(30\times10^3)$ or 16.7 microseconds. Accordingly, the signal envelope variations will again be ignored and the current signal Scrnt will only be reduced when if a subsequent reduction in the input signal amplitude occurs over a time span that significantly exceeds 16.7 microseconds.

Figure 4:
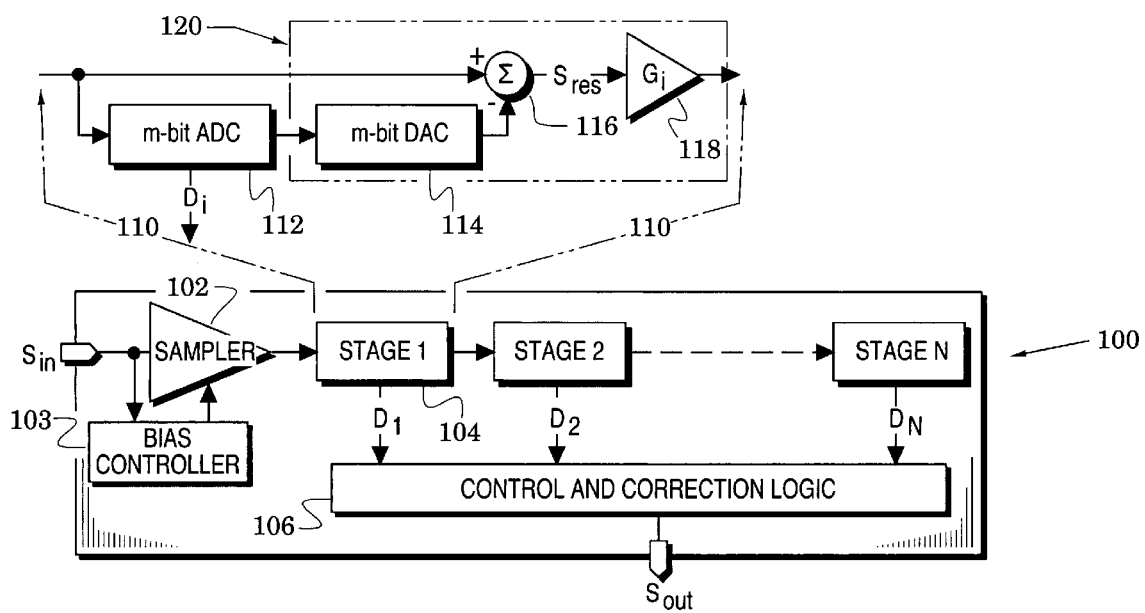
FIG. 4 is a diagram of a signal conditioning system whose efficiency is enhanced with either embodiment of FIGS. 1 and 2.

Bias controller embodiments of the invention are especially useful in signal-conditioning systems such as the pipelined analog-to-digital converter 100 of FIG. 4 which includes a sampler 102 that provides samples of an analog input signal $S_{in}$ to N cascaded converter stages 104 that successively convert each sample to a corresponding digital output signal $S_{out}$. Each pipelined stage 104 converts a respective analog signal to that stage's predetermined number of digital bits and passes an amplified residue signal $S_{res}$ to a succeeding converter stage 104.

As each succeeding stage converts its received residue signal, the preceding stage is converting a succeeding analog input signal. All converter stages, therefore, are simultaneously converting succeeding analog input signals to their respective digital bits with final converted words issuing from an associated control and correction logic 106 at the same rate as the sampling rate in the sampler 102.

Broken expansion lines 110 in FIG. 4 indicate that an exemplary converter stage comprises an analog-to-digital converter (ADC) 112 which provides at least one corresponding digital bit $D_i$ and also comprises a digital-to-analog (DAC) 114 that converts this bit (or bits) to an analog signal which is subtracted in a summer 116 from this stage's respective analog input to form an analog residue $S_{res}$ that is amplified in a respective amplifier 118 with a respective gain $G_i$ and passed to a successive converter stage for further conversion.

The DAC 114, summer 116 and amplifier 118 are generally referred to as a multiplying digital-to-analog converter (MDAC) which is collectively shown as the broken-line element 120. Generally, one or more redundant bits are generated in the converter stages and the control and correction logic 106 includes circuits (e.g., full adders) that use the bits of succeeding stages to correct preceding-stage errors that result from various degrading effects (e.g., offset and/or gain errors) and also includes circuits (e.g., shift registers) that time-align the corresponding digital bits.

The sampler 102 must provide accurate samples of the analog input signal $S_{in}$ as the frequency and amplitude of that signal vary up to respective maximum levels. In the past, the current to the sampler was generally set to a high level that is known to be sufficient for accurate sampling (i.e., enhanced system linearity) at the maximum levels. This means that system efficiency is sacrificed to insure accurate sampling over all possible levels of input signals. The system 100, however, includes a bias controller embodiment 103 of the present invention that is coupled to sense parameter levels of the analog input signal $S_{in}$ and, in response, provide a current bias to the sampler 102 whose level is adjusted to correspond to the sensed parameter levels. As a result, the efficiency of the converter 100 is substantially enhanced without substantially degrading system linearity.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of controlling a bias current, comprising the steps of:
   providing a derivative signal which is indicative of the derivative of a received input signal;
   altering a bias control signal in a first direction in response to an increase of said derivative signal;
   detecting a decrease of said derivative signal;
   at a selectable rate, altering said bias control signal in a second direction in response to said decrease;
   providing an enable signal in response to said decrease;
   in response to said enable signal, counting a clock signal to set said rate; and
   providing a bias current whose amplitude corresponds to said bias control signal.

2. The method of claim 1, further including the steps of:
indicating said increase and decrease in response to the difference between said derivative signal and a selectable reference signal; and
selecting said reference signal in response to said indicating step.

3. A bias controller, comprising:
a differentiator that provides a derivative signal which is indicative of the derivative of a received input signal;
a sensor configured to:
alter a bias control signal in a first direction in response to an increase of said derivative signal;
detect a decrease of said derivative signal; and
at a selectable rate, alter said bias control signal in a second direction in response to said decrease;
and a current source that provides a bias current whose amplitude corresponds to said bias control signal;
wherein said sensor includes:
a detector that provides an enable signal in response to said decrease; and
a counter that sets said rate in response to said enable signal.

4. The controller of claim 3, wherein said sensor includes a set of comparators coupled to said differentiator to indicate said increase and decrease.

5. The controller of claim 3, wherein said sensor includes a sampler coupled to said differentiator to indicate said increase and decrease.

6. The controller of claim 3, wherein said sensor further includes a comparator that indicates said increase and decrease in response to a difference between said derivative signal and a selectable reference signal and wherein said detector selects said reference signal in response to said comparator.

7. The controller of claim 6, further including:
a set of switches that provide said selectable reference signal; and
a decoder that commands said set in response to said detector.

8. A pipelined analog-to-digital converter that processes an analog signal to a corresponding digital signal, comprising:
a sampler that operates with a bias current to provide samples of said analog signal;
at least one converter stage that successively processes each of said samples to thereby provide said corresponding digital signal;
a differentiator that provides a derivative signal which is indicative of the derivative of said analog signal;
a sensor that alters a bias control signal in response to said derivative signal; and
a current source that provides said bias current with an amplitude that corresponds to said bias control signal;
wherein said sensor includes a detector configured to:
alter said bias control signal in a first direction in response to an increase of said derivative signal; and
at a selectable rate, alter said bias control signal in a second direction in response to a decrease of said derivative signal.

9. The converter of claim 8, wherein said sensor includes a set of comparators coupled to said differentiator to indicate said increase and decrease.

10. The converter of claim 8, wherein said sensor includes a second sampler coupled to said differentiator to indicate said increase and decrease.

11. The converter of claim 8, wherein said sensor includes a comparator that indicates said increase and decrease.

12. The converter of claim 11, further including:
a set of switches that access different reference signals; and
a decoder that commands said set in response to said detector to thereby provide said reference signal.

* * * * *